US012660626B2

(12) United States Patent
Eppich et al.

(10) Patent No.: US 12,660,626 B2
(45) Date of Patent: Jun. 16, 2026

(54) PATTERNING OF 3D NAND PILLARS AND FLYING BUTTRESS SUPPORTS WITH THREE STRIPE TECHNIQUE

(71) Applicant: Micron Technology, Inc., Boise, ID (US)

(72) Inventors: Anton P. Eppich, Boise, ID (US); Shruti Jain, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1014 days.

(21) Appl. No.: 17/860,027

(22) Filed: Jul. 7, 2022

(65) Prior Publication Data

US 2023/0395529 A1      Dec. 7, 2023

Related U.S. Application Data

(60) Provisional application No. 63/347,966, filed on Jun. 1, 2022.

(51) Int. Cl.
| | |
|---|---|
| *H10W 42/00* | (2026.01) |
| *H10B 41/27* | (2023.01) |
| *H10B 43/27* | (2023.01) |

(52) U.S. Cl.
CPC .......... *H10W 42/121* (2026.01); *H10B 41/27* (2023.02); *H10B 43/27* (2023.02)

(58) Field of Classification Search
CPC .............. H10B 20/40–65; H10B 53/20; H10B 41/20–27; H10B 43/20–27; H10B 51/20; H10B 63/84–845; H01L 23/49827; H01L 23/5384; H01L 23/481; H01L 2224/08165; H01L 2224/16165; H01L 2224/16235; H01L 2224/32165; H01L 2224/32235; H01L 2224/40165; H01L 2224/40235;

(Continued)

(56) References Cited

U.S. PATENT DOCUMENTS

| | | | |
|---|---|---|---|
| 2013/0334594 A1 | 12/2013 | Imonigie et al. | |
| 2015/0060998 A1* | 3/2015 | Mizushima ............ | H10B 43/27 438/270 |

(Continued)

OTHER PUBLICATIONS

U.S. Appl. No. 17/860,021—Unpublished Patent Application to Shruti Jain et al., filed Jul. 7, 2022, titled "Patterning of 3D NAND Pillars and Flying Buttress Supports With Two Stripe Technique", 31 pages.

*Primary Examiner* — Wael M Fahmy
*Assistant Examiner* — Quinton A Brasfield
(74) *Attorney, Agent, or Firm* — Dorsey & Whitney LLP

(57) ABSTRACT

A three-dimensional (3D) memory device including a stack of alternating supporting lattice layers and dielectric layers on a substrate, a plurality of memory pillars vertically penetrating the stack, each of the plurality of memory pillars including a plurality of vertically connected replacement gate (RG) memory cells that correspond to the supporting lattice layers, each of the memory pillars having a first polygon shape having at least six sides in a horizontal plane parallel to the supporting lattice layers, and a plurality of supporting buttress (SBT) pillars exclusive of any memory cells that are located at outside ends of the plurality of memory pillars and that vertically penetrate the stack, wherein the plurality of memory pillars and the plurality of SBT pillars are laterally connected by the supporting lattice layers.

12 Claims, 8 Drawing Sheets

Core Region 110

100

NAND Memory Pillar Hard Mask 102

Hard Mask Layer 130

SBT Pillar Hard Mask 104

A ← — — — — — — — — — — → A'

Support Region 120

(58) Field of Classification Search
  CPC ................................ H01L 2224/48235; H01L
    2225/06541–06544; H01L 2225/06548;
      H01L 21/76898; H01L 21/486
  See application file for complete search history.

(56)                   References Cited

U.S. PATENT DOCUMENTS

| | | | |
|---|---|---|---|
| 2015/0076586 A1 | 3/2015 | Rabkin et al. | |
| 2016/0013203 A1* | 1/2016 | Eom ...................... | H10B 43/27 |
| | | | 257/329 |
| 2017/0287927 A1 | 10/2017 | Lee et al. | |
| 2019/0214268 A1 | 7/2019 | Sawano et al. | |
| 2019/0319038 A1* | 10/2019 | Zhang ............... | H01L 21/76898 |
| 2021/0288058 A1* | 9/2021 | Nishimura ............. | H10B 43/10 |
| 2021/0399005 A1* | 12/2021 | Lee ........................ | H10B 43/10 |
| 2022/0208787 A1 | 6/2022 | Baek et al. | |
| 2023/0262977 A1* | 8/2023 | Lin ........................ | H10B 41/10 |
| | | | 257/314 |
| 2023/0395528 A1 | 12/2023 | Jain et al. | |

* cited by examiner

Hard Mask Layer 130

NAND Memory Pillar Hard Mask 102     SBT Pillar Hard Mask  104

Core Region 110

Support Region 120

100

330

Wide
Stripes
310

Narrow
Stripes 312

320

Wide
Stripes
306

Narrow
Stripes 308

310

Wide
Stripes
302

Narrow
Stripes 304

NAND Memory Pillar Hard Mask 102

Wide Stripes 306

Wide Stripes 302

Wide Stripes 310

Narrow Stripes 312

Narrow Stripes 304

Narrow Stripes 308

SBT Pillar Hard Mask 104

Narrow Stripes 304

Narrow Stripes 312

Narrow Stripes 308

SBT Pillar Hard Mask 104

Wide Stripes 302

Wide Stripes 310

Wide Stripes 306

NAND Memory Pillar Hard Mask 102

Figure 7:
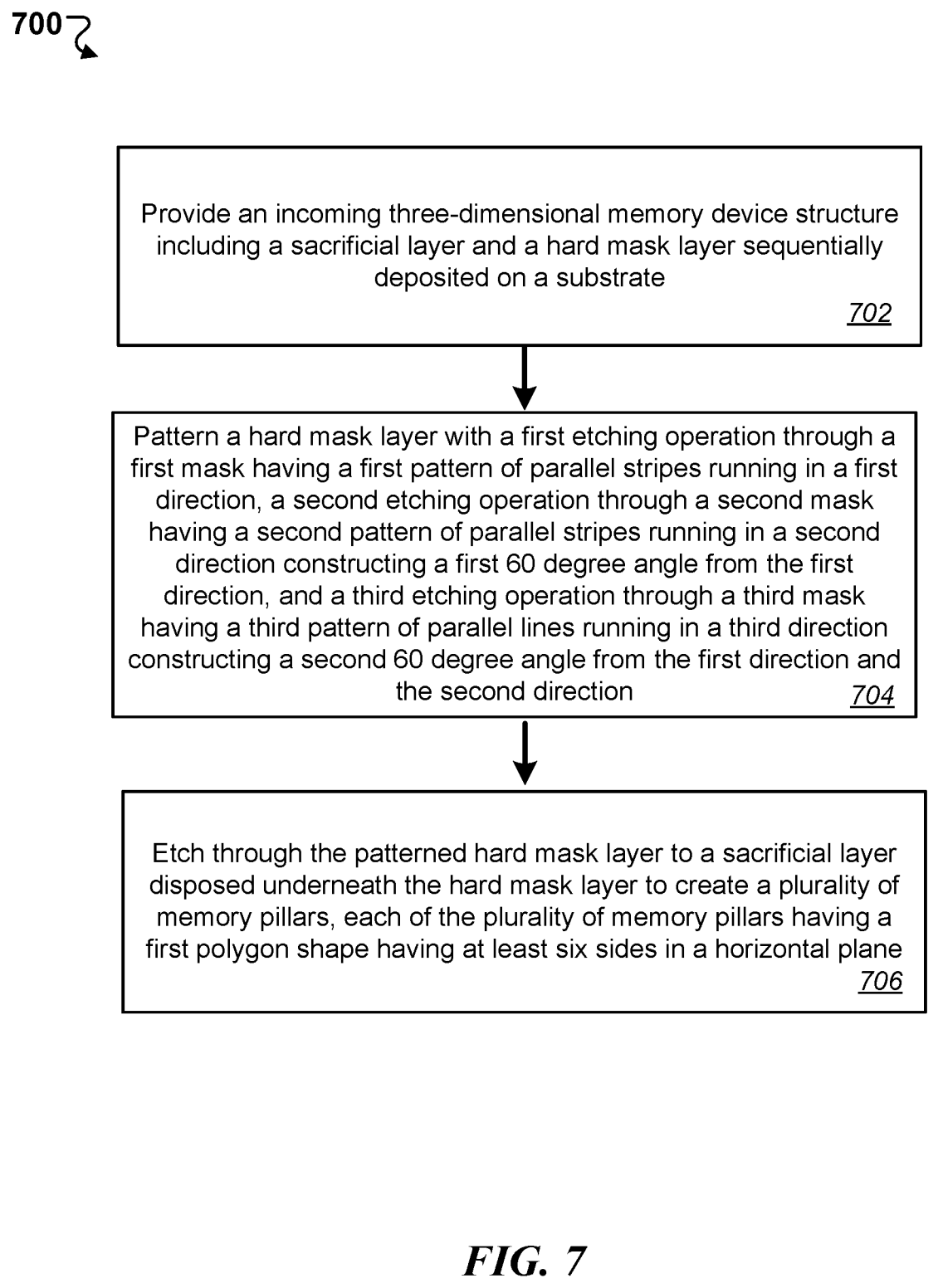

700

Provide an incoming three-dimensional memory device structure including a sacrificial layer and a hard mask layer sequentially deposited on a substrate

_702_

Pattern a hard mask layer with a first etching operation through a first mask having a first pattern of parallel stripes running in a first direction, a second etching operation through a second mask having a second pattern of parallel stripes running in a second direction constructing a first 60 degree angle from the first direction, and a third etching operation through a third mask having a third pattern of parallel lines running in a third direction constructing a second 60 degree angle from the first direction and the second direction     _704_

Etch through the patterned hard mask layer to a sacrificial layer disposed underneath the hard mask layer to create a plurality of memory pillars, each of the plurality of memory pillars having a first polygon shape having at least six sides in a horizontal plane

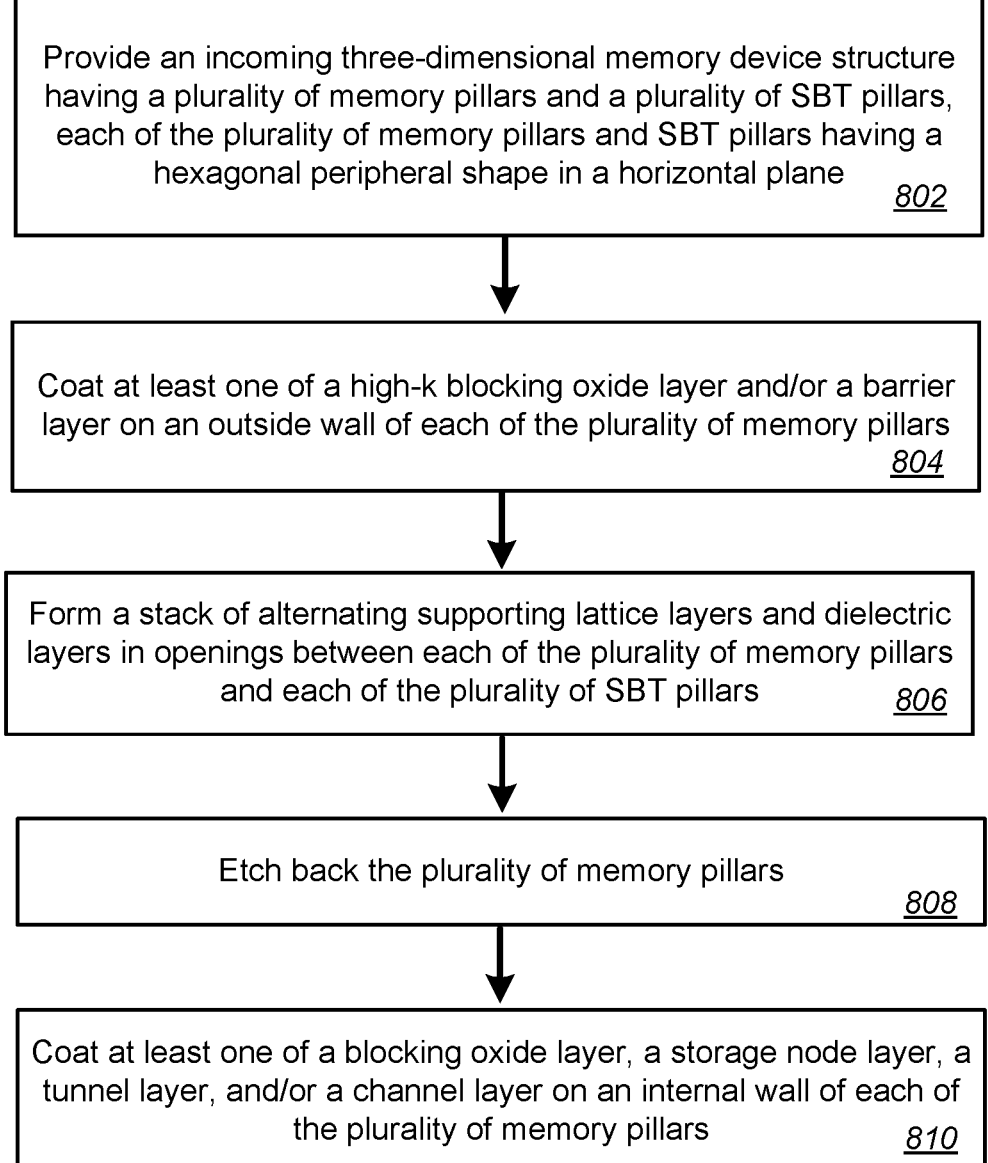

Provide an incoming three-dimensional memory device structure having a plurality of memory pillars and a plurality of SBT pillars, each of the plurality of memory pillars and SBT pillars having a hexagonal peripheral shape in a horizontal plane     *802*

Coat at least one of a high-k blocking oxide layer and/or a barrier layer on an outside wall of each of the plurality of memory pillars     *804*

Form a stack of alternating supporting lattice layers and dielectric layers in openings between each of the plurality of memory pillars and each of the plurality of SBT pillars     *806*

Etch back the plurality of memory pillars     *808*

Coat at least one of a blocking oxide layer, a storage node layer, a tunnel layer, and/or a channel layer on an internal wall of each of the plurality of memory pillars     *810*

*FIG. 8*

PATTERNING OF 3D NAND PILLARS AND FLYING BUTTRESS SUPPORTS WITH THREE STRIPE TECHNIQUE

CROSS-REFERENCE TO RELATED APPLICATION(S)

The present application claims priority to U.S. Provisional Patent Application No. 63/347,966, filed Jun. 1, 2022, the disclosure of which is incorporated herein by reference in its entirety.

This application contains subject matter related to an U.S. Provisional patent application by Shruti Jain et al. titled "PATTERNING OF 3D NAND PILLARS AND FLYING BUTTRESS SUPPORTS WITH TWO STRIPE TECH-NIQUE". The related application is assigned to Micron Technology, Inc., and is identified as U.S. Provisional Application No. 63/347,962, filed Jun. 1, 2022. The subject matter thereof is incorporated herein by reference thereto.

TECHNICAL FIELD

The present disclosure generally relates to semiconductor devices having three dimensional (3D) structures, and more particularly patterning memory pillars for 3D NAND memory device fabrication using a Litho-Etch-Litho-Etch-Litho-Etch (LELELE) technique.

BACKGROUND

Memory devices are widely used to store information related to various electronic devices such as computers, wireless communication devices, cameras, digital displays, automotive, artificial intelligence, and the like. Information is stored by programming different states of a memory cell. Various types of memory devices exist, such as non-volatile memory devices (e.g., NAND Flash memory devices) and volatile memory devices (e.g., dynamic RAM (DRAM), synchronous dynamic RAM (SDRAM), etc.). Improving memory devices, generally, may include increasing memory cell density by implementing a 3D memory architecture, e.g., keep scaling more memory cell layers to improve the area utilization of wafers. In fabricating the 3D NAND memory devices, printing scaled patterns on the hard mask with a necessary uniformity and evenness of shape is challengeable. For example, a single exposure technique generally utilized in 3D NAND memory device fabrication always results in uneven patterned feature size and shape on the hard mask due to its limitations. To form memory pillars in 3D NAND memory devices, manufacturers usually pattern a hard mask layer in a core region and a support region outside the edge of the core region, so as to improve the hard mark patterning uniformity through increasing the feature density in the support region.

BRIEF DESCRIPTION OF THE DRAWINGS

FIG. 7 illustrates a method of LELELE stripes patterning for fabricating dual sized staggered pillars in 3D NAND memory device according to embodiments of the invention.

FIG. 8 illustrates a method of fabricating a replacement gate 3D NAND memory device according to embodiments of the invention.

Figure 1:
FIG. 1 depicts a plane view of a 3D NAND memory device with patterned hard mask layer according to embodiments of the invention.

The drawings illustrate only example embodiments and are therefore not to be considered limiting in scope. The elements and features shown in the drawings are not necessarily to scale, emphasis instead being placed upon clearly illustrating the principles of the example embodiments. Additionally, certain dimensions or placements may be exaggerated to help visually convey such principles. In the drawings, the same reference numerals used in different embodiments designate like or corresponding, but not necessarily identical, elements.

DETAILED DESCRIPTION

The processing of 3D NAND memory devices involves patterning memory pillars or pillar openings for constructing memory cells. Before transferring hard mask patterns to memory pillars, manufacturers usually create additional features adjacent to the outside edge of the memory pillar hard mask features on the hard mask layer, in order to increase the feature density at the edge to improve the hard mask patterning uniformity. Single exposure lithography technique can be used to pattern the memory pillars hard mask to define the profile and dimension of memory pillars. However, it is a significant challenge to use single exposure lithography technique to print various sizes of features on the hard mask layer with necessary uniformity and evenness of shape.

To address these challenges and others, the present disclosure applies stripes masks to pattern polygon NAND memory cell layouts. In particular, the present disclosure uses a LELELE technique to pattern hexagonal features on the hard mask layer for etching NAND memory pillars. The LELELE steps create patterns of parallel stripes running along directions that are 60 degrees from each other. Specifically, the overlapped stripes patterns can be transferred to the hard mask layer to form uniform hexagonal peripheral shape features that are aligned in columns and rows. This disclosure also includes forming a grid of supporting buttress pillars (SBT) at the outside edge of the memory pillars by etching a sacrificial layer through the above-described hexagonal peripheral shape hard mask. Moreover, the SBT pillars are horizontally connected to the NAND memory pillars through a stack of supporting lattice layers. The SBT pillars are configured to provide structural support, through the stack of supporting lattice layers, to the NAND memory pillars during and after the memory pillars etch back process.

FIG. 1 depicts a plane view of a 3D NAND memory device 100 with patterned hard mask layer 130. The fabrication of the 3D NAND memory device 100, e.g., a replacement gate (RG) 3D NAND, generally includes patterning NAND memory pillars or pillar openings to form the RG memory cells. The patterning of NAND memory pillars may start from depositing a sacrificial material layer or a stack of layers on a substrate, followed with a coating of a hard mask layer 130 thereon. Then the hard mask layer 130 may be patterned through photo lithography techniques and etching processes to define desired hard mask patterns. The desired hard mask patterns can be further transferred to the NAND memory pillars by directional etching the sacrificial material layer through the hard mask patterns. In some embodiments, the hard mask layer 130 can be deposited on a substrate and the NAND memory pillars can be formed by etching the substrate through patterned hard mask layer 130.

In some embodiments, the hard mask layer 130 is patterned through a photo lithography process to form a core region 110 and a support region 120. Each of the core region 110 and the support region 120 includes patterned features in hexagonal peripheral shapes. As shown in FIG. 1, the core region 110 includes patterned memory pillar hard mask 102 in a larger hexagonal peripheral shape, and the supportive region 120 includes patterned supporting buttress pillar (SBT) pillar hard mask 104 in a smaller hexagonal peripheral shape. The patterned memory pillar hard mask 102 and the patterned SBT pillar hard mask 104 are all aligned in columns and rows. In this exemplary embodiment, the core region 110 may include 9 columns of NAND pillars that can be etched through the patterned main pillar hard mask 102. In addition, the support region 120 may include, on each outside edges of the core region 110, 3 columns of the SBT pillars that can be etched through the patterned SBT pillar hard mask 104. In other embodiments, the number of columns for the NAND memory pillars and the SBT pillars may vary. Each of the patterned main pillar hard mask 102 may have a dimension (i.e., a memory pillar diameter) in a range from about 50 nm to about 1 um. Additionally, each of the patterned SBT pillar hard mask 104 may have a smaller dimension (i.e., a SBT pillar diameter) from about 25 nm to about 500 nm.

In this exemplary embodiment, the rows of the patterned SBT pillars hard mask 104 are staggered to the rows of the patterned main pillars hard mask 102. As shown, the patterned SBT pillar hard mask 104 is disposed close to the edges of the core region 110 so as to provide an increased feature density thereon and to improve NAND memory pillars etch uniformity and evenness of shape. In some embodiments, the core region 110 and the support region 120 may include patterned features in polygon shapes having at least six sides, e.g., an octagonal peripheral shape having eight sides. In this example, a sequential litho-etch (LE) process, e.g., a LELELELE process, can be applied on the hard mask layer 130 form the octagonal peripheral shape hard mask patterns thereon.

As described, the patterned hard masks 102 and 104 can be formed from etching through a photoresist layer. For example, photoresist that is compatible with 157 nm, 193 nm, 248 nm or 365 nm wavelength systems, 193 nm wavelength immersion systems, or electron beam lithographic systems can be coated above the hard mask layer 130. In another example, the photoresist can be compatible with X-rays in EUV lithography systems having wavelength ranges between 13.0 nm and 14.0 nm. The photoresist layer can be patterned similarly to the hard mask features shown in FIG. 1 through being exposed to radiation through a reticle and the development. A positive photoresist in which the portion of photoresist exposed to light becomes soluble to the developer can be selected for the described technique.

In other embodiments, a negative photoresist in which the portion of photoresist exposed to light become insoluble to the developer can also be used. Complementary lithography masks will be used, however, corresponding to the types of photoresist selected, to achieve a same feature on the photoresist layer and the hard mask layer 130. The etching of the hard mask layer 130 can be conducted by a directional etching technique, for example, a reaction ion etching (RIE) technique, a plasma etching technique, a wet etching technique, or other suitable techniques. The photoresist can be stripped away afterwards.

In some embodiments, the hard mask layer 130 can be made of materials including at least one of anti-reflective coating (ARC) material, silicon oxide ($SiO_2$), and/or silicon. The ARC material may be a silicon-rich silicon oxynitride, a silicon-rich nitride, or a film that has desired etch selectivity relative to the sacrificial layer underneath. In some embodiments, the hard mask layer 130 may include combinations of layers of materials, e.g., a dielectric anti-reflective coating (DARC) above a bottom anti-reflective coating (BARC). In general, using ARC material as a hard mask layer may provide advantages for forming patterns with pitches near the photolithographic resolution limit. Here, the ARC material can enhance resolution by minimizing light reflections therefore increasing the precision of pattern edges defined by photolithography techniques. In some other embodiments, the hard mask layer 130 may include a combination of a thinner DARC layer and a thicker carbon-containing under layer. The carbon-containing layer disposed below the DARC layer may be an amorphous carbon layer formed by chemical vapor deposition (CVD) using a hydrocarbon compound, or mixture of such compounds, as carbon precursors including propylene, propyne, propane, butane, butylene, butadiene and acetylene. The underlaying carbon-containing layer may be highly transparent to light so that it offers further improvement for photo lithography by being transparent to the wavelengths of light used for alignment during the photoresist patterning. In this example, the patterning of NAND memory pillars starts from depositing a sacrificial material layer or a stack of layers on a substrate, followed with a coating of the thicker hard mask layer (e.g., a transparent carbon layer) and a thinner hard mask layer (e.g., a DARC layer) 130 thereon. The hard mask layer 130 is then patterned through photo lithography and etching processes to define desired hard mask patterns. The desired hard mask pattern can be transferred to the underlying thicker hard mask layer, which is then used to etch the NAND memory pillars by directional etching of the sacrificial material layer.

Figure 2:
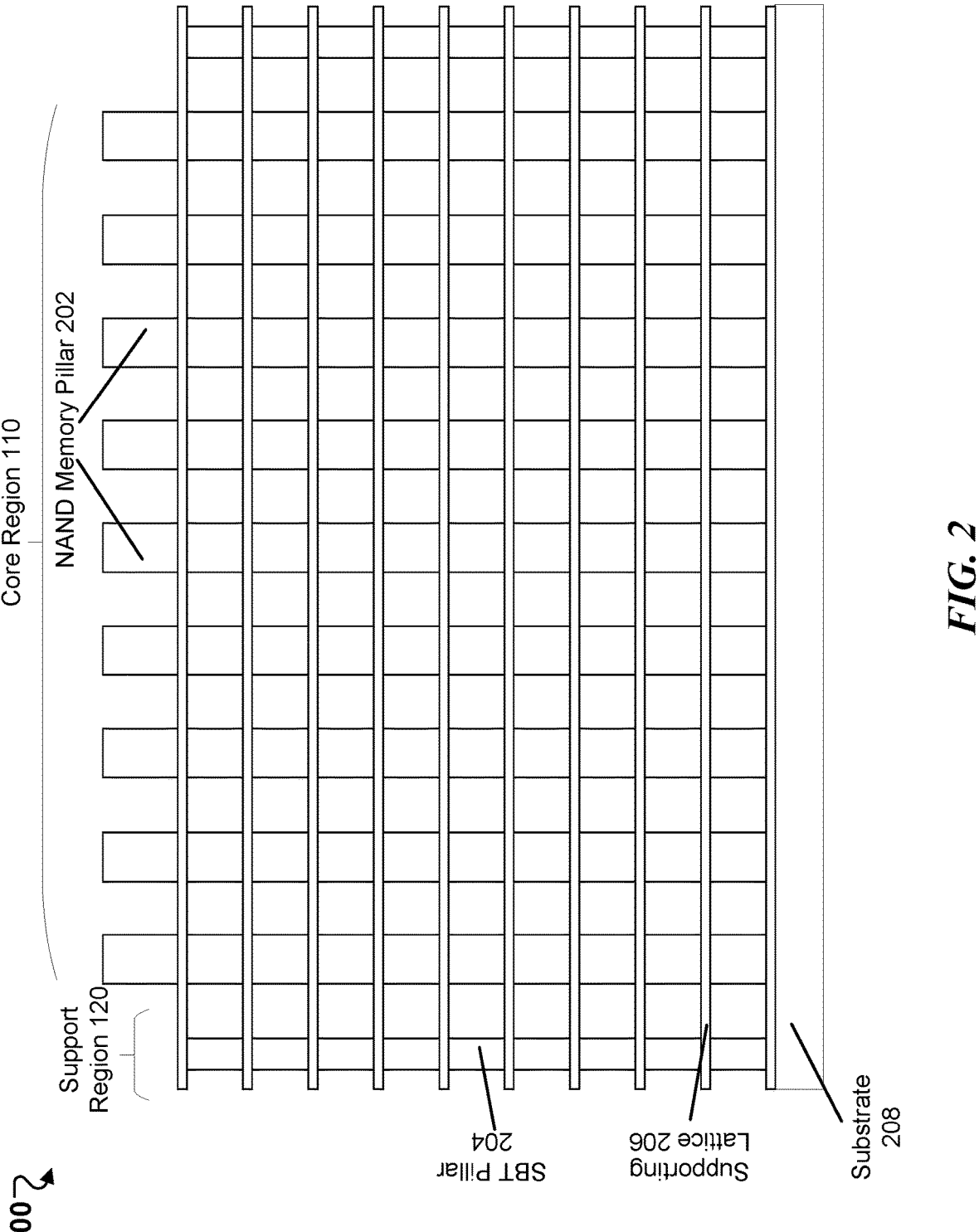
FIG. 2 depicts a cross-sectional view of the 3D NAND memory device after memory pillars patterning according to embodiments of the invention.

FIG. 2 depicts a cross sectional view of the 3D NAND memory device 100 after the NAND memory pillars 202 have been formed. As shown, the NAND memory pillars 202 and the SBT pillars 204 are disposed in the core region 110 and the support region 120 of the 3D NAND memory device 100, respectively. The fabrication of the NAND memory pillars 202 and the SBT pillars 204 can be conducted using a directional etching technique, e.g., etching the sacrificial layer or the stack of layers through patterned memory pillar hard mask 102 and patterned SBT pillar hard mask 104 described in FIG. 1. Here, the polygon shapes, e.g., hexagonal peripheral shapes, are transferred from the hard mask layer 130 to the NAND memory pillars 202 and the SBT pillars 204. In other words, all of the NAND memory pillars 202 and the SBT pillars 204 may have the hexagonal peripheral shape in the horizontal plane. Further, the dimension (e.g., a radius) of the NAND memory pillars 202 may be larger than the SBT pillars 204.

In one embodiment, the core region 110 of the 3D NAND memory device 100 includes 9 columns of NAND memory pillars 202, each of the NAND memory pillars being disposed vertically on a substrate 208. The NAND memory pillars 202 also penetrate through a plurality of supporting lattice layers 206 that are aligned in the horizontal plane and that are parallel to the substrate 208. Here, each of the NAND memory pillars 202 may have a dimension (i.e., a memory pillar width between parallel sides) in the horizontal plane in a range from about 50 nm to about 1 um, similar to that of the patterned memory pillar hard mask 102. In one embodiment, the NAND memory pillars 202 each have a height that equates to or longer than a stack of NAND memory cells, e.g., a stack of 140 RG memory cells that are vertically aligned in the 3D NAND memory device 100.

In this exemplary embodiment, the 3D NAND memory device 100 also includes 3 columns of SBT pillars 204 disposed at outside ends of the plurality of NAND memory pillars 202. The SBT pillars 204 may be formed by etching the sacrificial layer or the stack of layers through the patterned SBT pillar hard mask 104. As shown, the SBT pillars 204 are vertically aligned on the substrate 208 and penetrate through the plurality of supporting lattice layers 206. Here, each of the SBT pillars 204 may have a smaller dimension (i.e., a SBT pillar width between parallel sides) in the horizontal plane from about 25 nm to about 500 nm, similar to that of the patterned SBT pillar hard mask 104. In this embodiment, the SBT pillars 204 may have a height equates to or shorter than the NAND memory pillars 202. Moreover, the NAND memory pillars 202 and the SBT pillars 204 may have a same pitch in the horizontal plane. The pitch of the NAND memory pillars 202 and the SBT pillars 204 may range from 60 nm to 1 um.

As described, the NAND pillars 202 and the SBT pillars 204 are formed by etching through the sacrificial layer or a stack of layers deposited on the substrate 208. The sacrificial layer or the stack of layers, as well as the NAND memory pillars 202 and the SBT pillars 204 can be made of materials including polysilicon or single crystal silicon. In other embodiments, the NAND memory pillars 202 and the SBT pillars 204 can be made of different materials by depositing corresponding films in the core region 110 and the support region 120, respectively. In one embodiment, the supporting lattice layers 206 may be made of insulating dielectric materials, e.g., tetraethyl orthosilicate (TEOS), silicon oxide (SiO), silicon nitride (SiN), silicon borocarbonitride (SiBCN), silison oxycarbonitride (SiOCN), silicon oxycarbide (SiOC), silicon carbonitride (SiCN), silicon boronitride (SiBN), a low-k dielectric material, or a combination thereof. The interval between the plurality of supporting lattice layers 206 may be filled by other insulating dielectric materials. In other embodiments, the supporting lattice layers 206 can be made of conductive materials including at least one of copper, tungsten, molybdenum, nickel, titanium, tantalum, platinum, silver, gold, ruthenium, iridium, rhenium, rhodium, or alloys thereof. In some other embodiments, the supporting lattice layers 206 may be made of polysilicon or a single crystal silicon. The supporting lattice layers 206 can be configured to perform as wordlines that horizontally connect the 3D NAND memory cells' control gates.

In one embodiment, the SBT pillars 204 disposed in the support region 120 are configured to provide structural support to the NAND memory pillars 202 disposed in the core region 110. For example, the SBT pillars 204 are connected to the NAND memory pillars 202 through the plurality of supporting lattice layers 206. The SBT pillars 204 can provide structural support to the NAND memory pillars 202, specifically the columns of NAND pillars disposed at edges of the core region 110. The SBT pillars 204, working together with the plurality of supporting lattice layers 206, forms a three-dimensional lattice within and during processes of the 3D NAND memory device 100, in which the NAND pillars 202 can be stabilized. Specifically, the SBT pillars 204 can support the NAND memory pillar array during a NAND memory pillars 202 etch back process and other following processes.

Figures 3A, 3B, 3C:
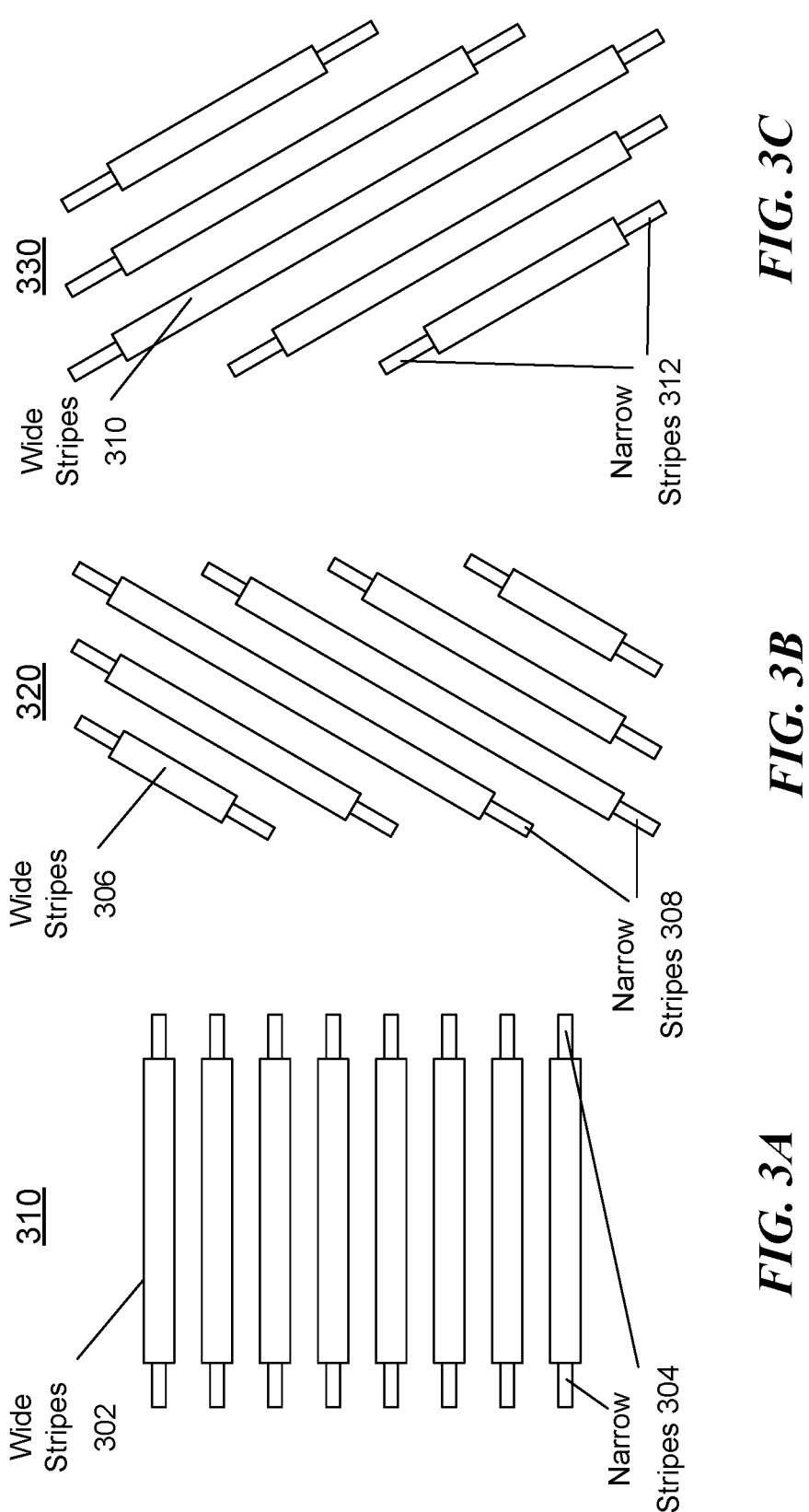
FIGS. 3A-3C depict a first horizontal stripes pattern, a second angled right stripes pattern, and a third angled left stripes pattern respectively according to embodiments of the invention.

Turning to FIGS. 3A-3C which depict plane views of a first horizontal stripes pattern 310, a second angled right stripes pattern 320, and a third angled left stripes pattern 330, respectively. These stripes patterns 310, 320, and 330 can be firstly formed on the photoresist layer and then transferred to the hard mask layer 130. As described earlier, the NAND memory pillars 202 of the 3D NAND memory device 100 can be formed by patterning the hard mask layer 130 and etching the underneath sacrificial layer through the patterned hard mask layer 130. In one embodiment, the patterning of the hard mask layer 130 can be conducted by the LELELE technique for stripes patterning, i.e., sequentially forming these stripes pattern 310, 320, and 330 in three rounds of LE processes.

In one embodiment and as shown in FIG. 3A, the first stripes pattern 310 includes a plurality of wide stripes 302 and a plurality of narrow stripes 304, which are all aligned in parallel along a first horizontal direction. The narrow stripes 304 extend from both ends of the wide stripes 302. The wide stripes 302 and the narrow stripes 304 are all aligned in a first pitch, which can be in a range from 60 nm to 1 um. In this exemplary embodiment, the wide stripes 302 may have a first width in a range from about 50 nm to about 1 um. In contrast, the narrow stripes 304 may have a second width that is half of the first width and that is in a range from about 25 nm to about 500 nm.

In the exemplary embodiment and as shown in FIG. 3B, the second stripes pattern 320 includes a plurality of wide stripes 306 and a plurality of narrow stripes 308, which can have similar lengths, widths, relative positions, and pitches to that of the plurality of wide stripes 302 and plurality of narrow stripes 304 of the first stripes pattern 310, respectively. However, the plurality of wide stripes 306 and a plurality of narrow stripes 304 are all oriented in an angled right direction, e.g., 60 degrees from the horizontal direction, as shown in FIG. 3B. The narrow stripes 308 extend from both ends of the wide stripes 306. Here, the wide stripes 306 and the narrow stripes 308 are both aligned in the first pitch ranging from 60 nm to 1 um. Further, the wide stripes 306 may have a width similar to the wide stripes 302 and in a range from about 50 nm to about 1 um. In contrast, the narrow stripes 308 may have a width similar to the narrow stripes 304 and in a range from about 25 nm to about 500 nm. In this example, the wide stripes 306 as well as the narrow stripes 308 extending from the wide stripes 306 may shift along the angled right direction.

In the exemplary embodiment and as shown in FIG. 3C, the third stripes pattern 330 includes a plurality of wide stripes 310 and a plurality of narrow stripes 312, which can have similar lengths, widths, relative positions, and pitches to that of the plurality of wide stripes 302 and plurality of narrow stripes 304 of the first stripes pattern 310, respectively. However, the plurality of wide stripes 310 and a plurality of narrow stripes 312 are all oriented in an angled left direction, e.g., 60 degrees from the horizontal direction or the angled right direction, as shown in FIG. 3C. The narrow stripes 312 extend from both ends of the wide stripes 310. Here, the wide stripes 310 and the narrow stripes 312 are both aligned in the first pitch ranging from 60 nm to 1 um. Further, the wide stripes 310 may have a second width similar to the wide stripes 302 and in a range from about 50 nm to about 1 um. In contrast, the narrow stripes 312 may have a width similar to the narrow stripes 304 and in a range from about 25 nm to about 500 nm. In this example, the wide stripes 310 as well as the narrow stripes 312 extending from the wide stripes 306 may shift along the angled left direction.

The number of the wide stripes 302, 306, and 310, as well as that of the narrow stripes 304, 308, and 312 may vary. In some embodiments, the stripes pattern 310 may include 9 or 16 wide stripes and 9 or 16 pairs of narrow stripes attached thereon respectively in the first direction. The stripes pattern 320 may include 200 or more wide stripes and 200 or more pairs of narrow stripes attached thereon respectively in the second angled right direction. The stripes pattern 310 may include 200 or 300 wide stripes and 200 or 300 pairs of narrow stripes attached thereon respectively in the third angled left direction.

In some embodiments, the plurality of wide stripes 302 and plurality of narrow stripes 304 of the first stripes pattern 310 can be processed to be along the vertical direction in the plane view of the hard mask layer 130. In contrast, the plurality of wide stripes 306 and plurality of narrow stripes 308 of the second strip pattern 320 can be processed in an angle right direction 60 degrees to the first vertical direction. Further, the plurality of wide stripes 310 and plurality of narrow stripes 312 of the third strip pattern 330 can be processed in an angled left direction 60 degrees to the first vertical direction. In some other embodiments, the plurality of wide stripes 302 and the plurality of narrow stripes 304 of the first strip pattern 310 can be formed along a first random direction, e.g., a right tilted 45 degrees direction. In contrast, the plurality of wide stripes 306 and the plurality of narrow stripes 308 of the second strip pattern 320 can be formed in a second direction 60 degrees to the first random direction. Further, the plurality of wide stripes 310 and the plurality of narrow stripes 312 of the third strip pattern 330 can be formed in a third direction 60 degrees to either of the first random direction or the second direction.

Figure 4:
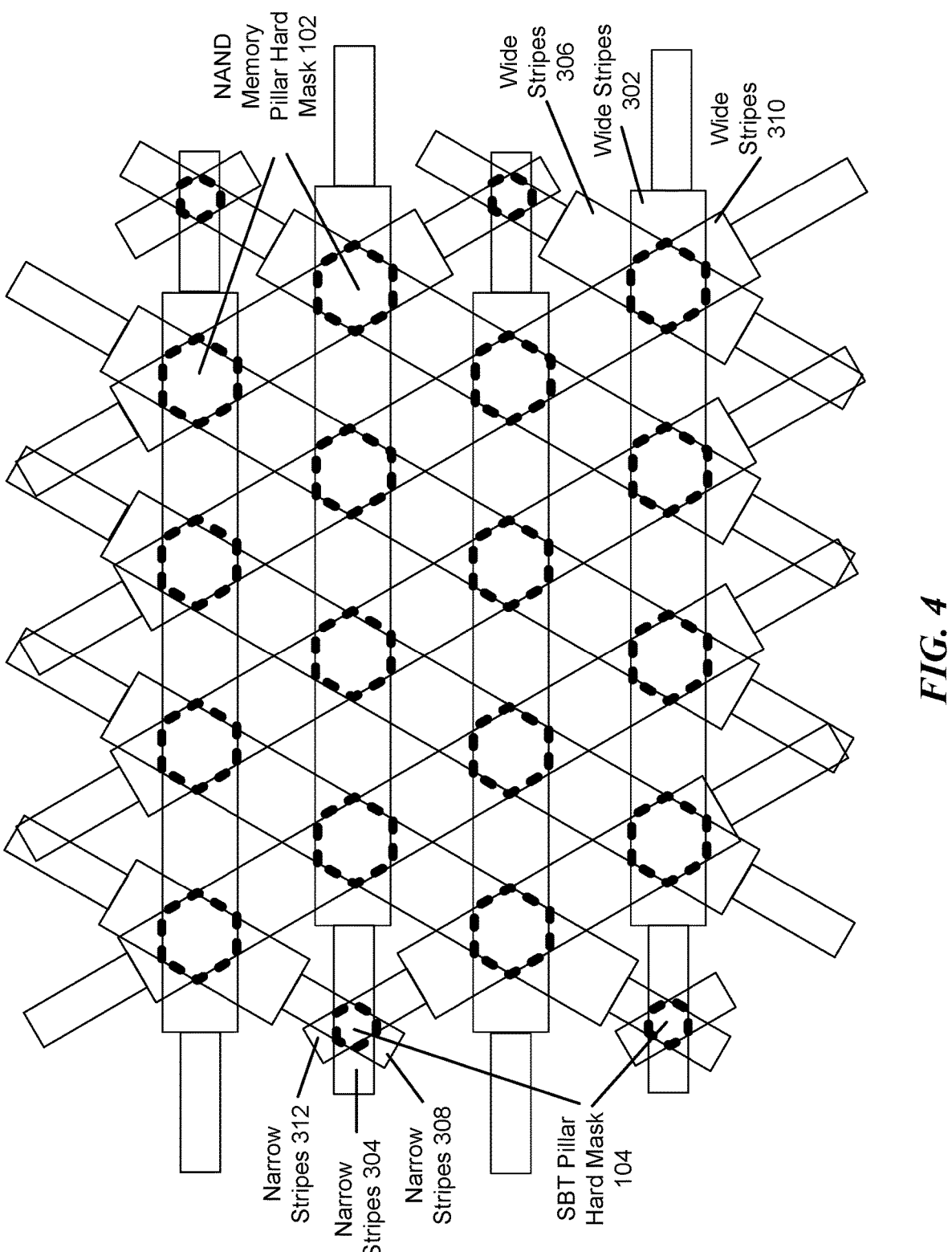
FIG. 4 illustrates a patterned dual-size staggered 3D NAND hard mask for fabricating a 3D NAND memory device according to embodiments of the invention.

FIG. 4 illustrates a patterned dual-size staggered hard mask for 3D NAND memory pillars patterning in a plane view. The patterned hard mask layer 130 includes a plurality of NAND memory pillar hard mask 102 disposed in the center, and a plurality of SBT pillar hard mask 104 disposed at the outside edges of the plurality of NAND memory pillar hard mask 102. As shown, the plurality of NAND memory pillar hard mask 102 and the plurality of SBT pillar hard mask 104 are formed by overlaying the first stripes pattern 310, the second stripes pattern 320, and the third stripes pattern 330 sequentially on the hard mask layer 130. In addition, the plurality of NAND pillar hard mask 102 and the plurality of SBT pillar hard mask 104 are aligned in columns and rows.

In one embodiment, each of the plurality of NAND pillar hard mask 102 has a first hexagonal peripheral shape indicated by the larger dash block. Similarly, each of the plurality of SBT pillar hard mask 104 has a second hexagonal peripheral shape indicated by the smaller dash block. The plurality of NAND pillar hard mask each have a side length equal to the first width of the wide stripes 302, 306, and 310. Similarly, the plurality of SBT pillar hard mask 104 each have a side length equal to the second width of the narrow stripes 304, 308, and 312. In this embodiment, the plurality of SBT pillar hard mask 104 are staggered to the plurality of NAND pillar hard mask 102, to assist in increasing feature density on the outside edge of the core region 110.

In one embodiment, each of the stripes patterns 310, 320, and 330 described in FIG. 3 is formed by etching through at least an one third thickness of the hard mask layer 130. As shown in FIG. 4, the NAND memory pillar hard mask 102 and the SBT pillar hard mask 104 are formed by overlapping the first stripes pattern 310, the second stripes pattern 320, and the third stripes pattern 330 in the LELELE process. The remaining portions of the hard mask layer 130, other than the patterned NAND memory pillar hard mask 102 and the patterned SBT pillar hard mask 104, can be removed during the etching steps of the LELELE process.

Figures 5A, 5B:
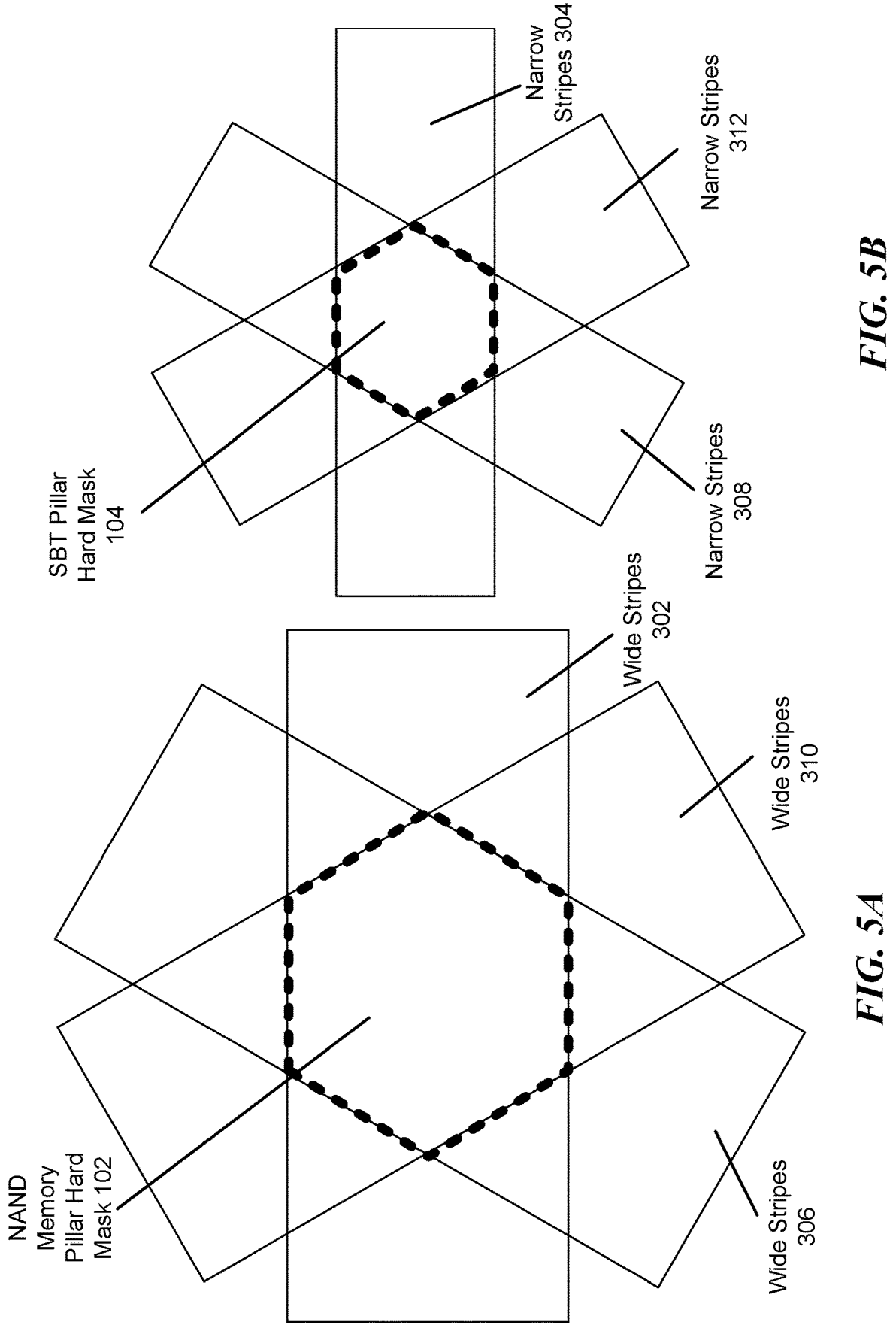
FIGS. 5A-5B illustrate a zoomed in large stripes patterned hexagonal hard mask for memory pillars fabrication and a zoomed in smaller stripes patterned hexagonal hard mask for smaller pillars fabrication according to embodiments of the invention.

FIGS. 5A and 5B illustrate a zoomed in large stripe patterned hexagonal hard mask 102 for memory pillars 202 fabrication and a zoomed in smaller stripes patterned hexagonal hard mask 104 for SBT pillars 204 fabrication. It is shown that the NAND memory pillar hard mask 102 and SBT pillar hard mask 104 are each formed through overlaying the patterned wide stripes and the narrow stripes, respectively. As described, each of the NAND pillar hard mask 102 has a hexagonal peripheral shape that is determined by angles between the wide stripes 302, 306, and 310. Similarly, each of the SBT pillar hard mask 104 has a hexagonal peripheral shape that is determined by angles between the narrow stripes 304, 308, and 312.

In one embodiment, the uniformities of the NAND memory pillar hard mask 102 and SBT pillar hard mask 104 can be determined by line edge or width (LER/WER) roughness of the patterned stripes described in FIGS. 3-5. As described, the stripes patterns 310, 320, and 330 can be formed in the LELELE process. Further, the stripe line edge roughness and width roughness of the stripes patterns can be optimized in each of the LE processes. As a result, the optimized LER/WER roughness of each of the sequential LE process can be cumulated and contribute an improved hexagonal peripheral shape uniformity for the grid of NAND memory pillar hard mask 102 and the grid of SBT pillar hard mask 104. The improved NAND memory pillar hard mask uniformity can be transferred to the grid of NAND memory pillar 202, therefore improving performance of the 3D NAND memory device 100.

Figure 6:
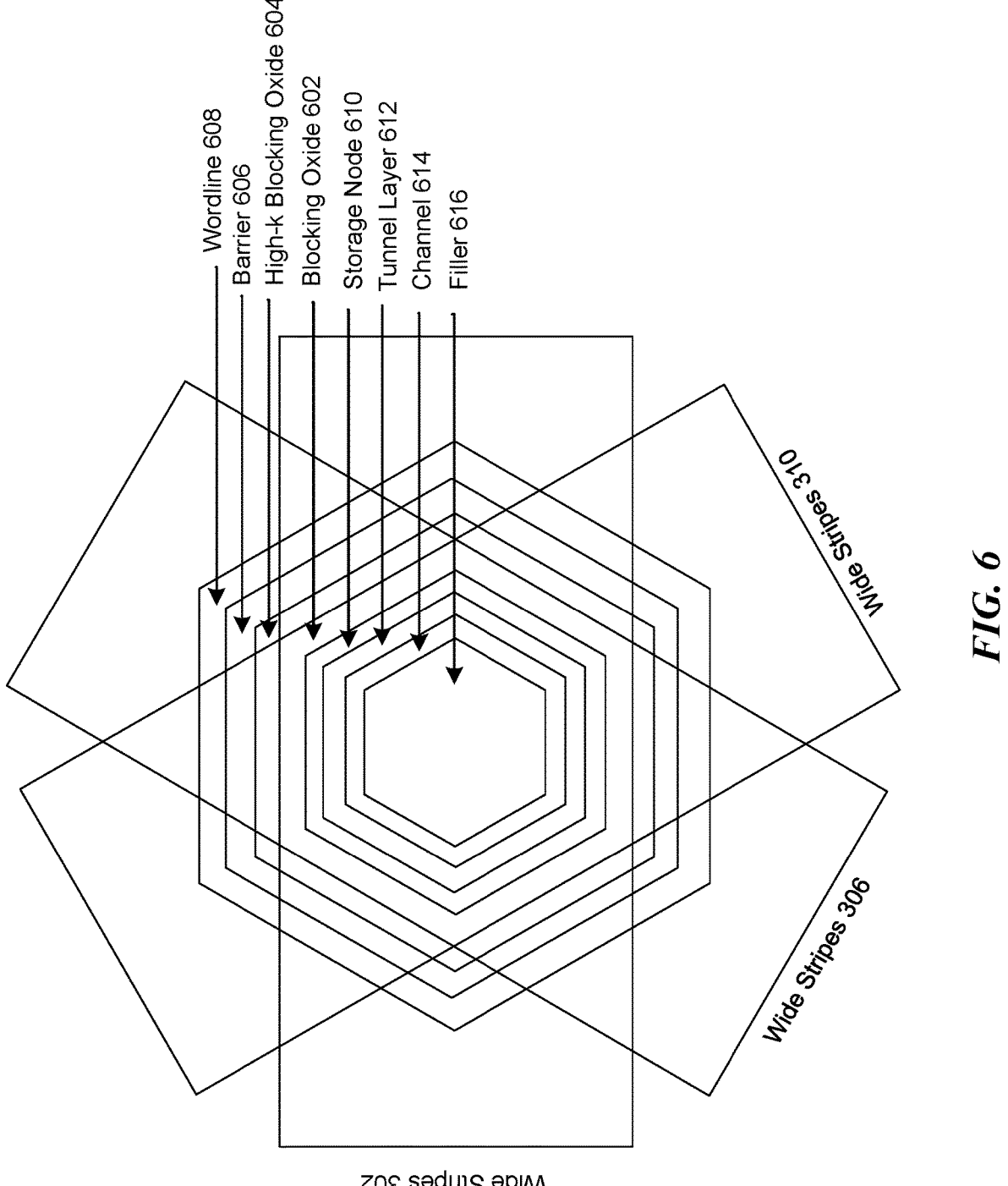
FIG. 6 depicts a plan view of a replacement gate memory cell of a 3D NAND memory device according to embodiments of the invention.

FIG. 6 depicts a plan view of a RG memory cell 600 of the 3D NAND memory device 100. As described, each of the NAND memory pillar 202 can be fabricated to contain a plurality of RG memory cells that are vertically stacked in the core region 110. In one embodiment, the hexagonal peripheral shape of the NAND memory pillar 202 can be presented at the boundary between the blocking oxides. The RG memory call may include a high-k blocking oxide layer 604, a barrier layer 606, and/or a wordline 608 that are disposed outside the hexagonal peripheral shape of the NAND memory pillar 202. Specifically, the high-k blocking oxide 604 and the barrier 606 can be sequentially coated on the outer sidewall of the NAND memory pillar 202, after the NAND memory pillar 202 being formed through etching the sacrificial layer. The RG memory cell may also include a blocking oxide layer 602, a storage node 610, a tunnel layer 612, a channel 614, and/or a filler 616. The blocking oxide layer 602, the storage node 610, the tunnel layer 612, and the channel 614 can be sequentially coated on an inner sidewall of the NAND memory pillar 202 after a NAND memory pillar etch back process. The filler 616 can be formed as a channel plug to fill the recess of the RG memory cell 600.

In one embodiment, the ingredient layers of the RG memory cell 600 including the blocking oxide layer 602, the high-k blocking oxide layer 604, the barrier layer 606, the wordline 608, the storage node 610, the tunnel layer 612, the channel 614, and/or the filler 616, can each be conformally coated on the sidewalls of the NAND memory pillar 202, therefore preserving a same hexagonal peripheral shape to the NAND memory pillar 202.

FIG. 7 illustrates a method 700 of LELELE stripes patterning for fabricating dual sized staggered pillars in the 3D NAND memory device 100. Referring to FIGS. 1-6, the method 700 includes providing an incoming three-dimensional memory device structure including a sacrificial layer and a hard mask layer sequentially deposited on a substrate, at 702. For example, a sacrificial layer or a stack of layers can be deposited on the substrate 208. The hard mask layer 130 can be further deposited on the sacrificial layer or the stack of layers for NAND memory pillars patterning.

The method 700 also includes patterning a hard mask layer with a first etching operation through a first mask having a first pattern of parallel stripes running in a first direction, a second etching operation through a second mask having a second pattern of parallel stripes running in a second direction constructing a first 60 degrees angle from the first direction, a third etching operation through a third mask having a third pattern of parallel lines running in a third direction constructing a second 60 degrees angle from the first direction and the second direction, at 704. For example, the hard mask layer 130 can be patterned by three single exposure lithography steps, e.g., forming the first stripes pattern 310, the second stripes pattern 320, and the third stripes pattern 330, sequentially on the hard mask layer 130. The first stripes pattern 310 includes wide stripes 302 and narrow stripes 304 all along the horizontal direction. In addition, the second stripes pattern 320 includes wide stripes 306 and narrow stripes 308 all along the angled right direction. Further, the third stripes pattern 330 includes wide stripes 310 and narrow stripes 312 all along the angled left direction.

The method 700 further includes etching through the patterned hard mask layer to a sacrificial layer disposed under the hard mask layer to create a plurality of memory pillars and SBT pillars, each of the plurality of memory pillars having a first polygon peripheral shape and each of the plurality of SBT pillars having a second polygon peripheral shape, in a horizontal plane, at 706. For example, the sacrificial layer or the stack of layers can be etched through the NAND memory pillar hard mask 102 and the SBT pillar hard mask to form the NAND pillar 202 and SBT pillars 204, respectively. The patterned hard mask features can be transferred to the NAND memory pillar 202 and SBT pillars 204, both having a hexagonal peripheral shape in the plane view. The dimension of the SBT pillar 204 can be smaller than the NAND memory pillar 202. In some embodiments, the NAND memory pillars 202 and the SBT pillars 204 can be formed by different etching processes.

Turning now to FIG. 8, a method 800 of fabricating a RG 3D NAND memory device 100. The method 800 includes providing an incoming three-dimensional memory device structure having a plurality of memory pillars and a plurality of SBT pillars, each of the plurality of memory pillars and SBT pillars having a hexagonal peripheral shape in a horizontal plane, at 802. For example, as described in FIG. 7, the plurality of NAND pillars 202 and the plurality of SBT pillars 204 can be fabricated on the substrate 208, both having a hexagonal peripheral shape in the plane view.

The method 800 also includes coating at least one of a high-k blocking oxide layer and/or a barrier layer on an outside wall of each of the plurality of memory pillars, at 804. For example, the high-k blocking oxide 604 and the barrier 606 can be sequentially coated on the outer sidewall of the NAND pillars 102, after the NAND pillar 102 being formed in the 3D NAND memory device 100. The process can further include forming the wordline 608 outside the barrier layer 606.

The method 800 also includes forming a stack of alternating supporting lattice layers and dielectric layers in openings between each of the plurality of memory pillars and each of the plurality of SBT pillars, at 806. For example, the NAND memory pillar openings can be filled by a stack of supporting lattice layers 206 and dielectric layers that are alternatively aligned through a height of the 3D NAND memory device 100. The supporting lattice layers 206 connect the SBT pillars 204 and the NAND memory pillars 202 horizontally, providing structural support to the NAND memory pillars 202 during and after the NAND memory pillar etch back process.

The method 800 further includes etching back the plurality of memory pillars, at 808. For example, the NAND memory pillars 202 can be further etched back by an etch process that is selective to the high-k blocking oxide layer 604, in order to expose inner space of the NAND memory pillars 202 for continuous RG memory cell fabrication.

Lastly, the method 800 includes coating at least one of a blocking oxide layer, a storage node layer, a tunnel layer, and/or a channel layer on an internal wall of each of the plurality of memory pillars, at 810. For example, the blocking oxide layer 602, the storage node 610, the tunnel layer 612, and the channel 614 can be sequentially coated on an inner sidewall of the NAND pillar 102 after the NAND pillars have been etched back. The filler 616 can further be formed as a channel plug to fill the recess of the RG memory cell.

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

In accordance with one aspect of the present disclosure, the semiconductor devices illustrated above could be memory dice, such as dynamic random access memory (DRAM) dice, NOT-AND (NAND) memory dice, NOT-OR (NOR) memory dice, magnetic random access memory (MRAM) dice, phase change memory (PCM) dice, ferroelectric random access memory (FeRAM) dice, static random access memory (SRAM) dice, or the like. In an embodiment in which multiple dice are provided in a single assembly, the semiconductor devices could be memory dice of a same kind (e.g., both NAND, both DRAM, etc.) or memory dice of different kinds (e.g., one DRAM and one NAND, etc.). In accordance with another aspect of the present disclosure, the semiconductor dice of the assemblies illustrated and described above could be logic dice (e.g., controller dice, processor dice, etc.), or a mix of logic and memory dice (e.g., a memory controller die and a memory die controlled thereby).

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "top," "bottom," "over," "under," "above," "below", "left," and "right" can refer to relative directions or positions of features in the semiconductor devices in view of the orientation shown in the Figures. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A three-dimensional (3D) memory device, comprising:
a stack of alternating supporting lattice layers and dielectric layers on a substrate;
a plurality of memory pillars vertically penetrating the stack, each of the plurality of memory pillars including a plurality of vertically connected replacement gate (RG) memory cells that correspond to the supporting lattice layers, each of the plurality of memory pillars having a hexagonal shape in a horizontal plane parallel to the supporting lattice layers; and
a plurality of supporting buttress (SBT) pillars exclusive of any memory cells that are located at outside ends of the plurality of memory pillars and that vertically penetrate the stack, wherein the plurality of memory pillars and the plurality of SBT pillars are laterally connected by the supporting lattice layers,
wherein first sides of the hexagonal shape of a first subset of the plurality of memory pillars lie in a first plane, second sides of the hexagonal shape of a second subset of the plurality of memory pillars lie in a second plane, and third sides of the hexagonal shape of a third subset of the plurality of memory pillars lie in a third plane.

2. The 3D memory device of claim 1, wherein each of the plurality of RG memory cells includes at least one of a channel, a tunnel layer, a storage node layer, a blocking oxide layer, a high-k blocking oxide layer, and/or a barrier.

3. The 3D memory device of claim 1, wherein the supporting lattice layers are made of electrically conductive materials and configured to electrically connect the plurality of memory pillars as wordline electrodes.

4. The 3D memory device of claim 1, further comprising a plurality of wordline electrodes, wherein each of the plurality of wordline electrodes is embedded in a dielectric layer of the stack, wherein each of the plurality of wordline electrodes is electrically connected to the plurality of memory pillars, and wherein the supporting lattice layers are made of dielectric materials.

5. The 3D memory device of claim 1, wherein the plurality of SBT pillars each have a second hexagonal shape in the horizontal plane, and wherein a dimension of the plurality of SBT pillars in the horizontal plane is smaller than that of the plurality of memory pillars.

6. The 3D memory device of claim 1, wherein the plurality of SBT pillars are disposed in a staggered pattern relative to the plurality of memory pillars in the horizontal plane.

7. The 3D memory device of claim 1, wherein the dielectric layers include at least one of polyimide, spin-on glass, tetraethoxysilane (TEOS), plasma oxide, oxynitride, and/or silicon carbon nitride.

8. A three-dimensional (3D) memory device, comprising:
a grid of memory pillars arranged in columns and rows, wherein each of the grid of memory pillars has a hexagonal shape in a horizontal plane, each of the grid of memory pillars includes a plurality of replacement gate (RG) memory cells that are vertically connected,
wherein first sides of the hexagonal shape of a first subset of the grid of memory pillars lie in a first plane, second sides of the hexagonal shape of a second subset of the grid of memory pillars lie in a second plane, and third sides of the hexagonal shape of a third subset of the grid of memory pillars lie in a third plane.

9. The 3D memory device of claim 8, further comprising:

a grid of supporting buttress (SBT) pillars exclusive of any RG memory cells, the grid of SBT pillars being located at outside ends of the grid of memory pillars, wherein each of the grid of SBT pillars has a second hexagonal shape in the horizontal plane.

10. The 3D memory device of claim 9, wherein a dimension of the grid of SBT pillars in the horizontal plane is smaller than that of the grid of memory pillars.

11. The 3D memory device of claim 9, further comprising:

a stack of alternating supporting lattice layers and dielectric layers on a substrate, wherein the grid of memory pillars and the grid of SBT pillars vertically penetrate the stack, and wherein the grid of memory pillars and the grid of SBT pillars are laterally connected by the supporting lattice layers.

12. The 3D memory device of claim 11, wherein the supporting lattice layers are made of electrically conductive materials and configured to electrically connect the grid of memory pillars as wordline electrodes.

\* \* \* \* \*